(12) United States Patent
Wang et al.

(10) Patent No.: US 10,811,221 B1
(45) Date of Patent: Oct. 20, 2020

(54) SECONDARY ELECTRON DETECTION EFFICIENCY

(71) Applicant: FEI Company, Hillsboro, OR (US)

(72) Inventors: Qinsong Steve Wang, Fremont, CA (US); Jim McGinn, Portland, OR (US); Peter Tvarožek, Fremont, CA (US); Amir Weiss, Sunnyvale, CA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/370,066

(22) Filed: Mar. 29, 2019

(51) Int. Cl.
*H01J 37/244* (2006.01)
*H01J 37/21* (2006.01)

(52) U.S. Cl.
CPC ............ *H01J 37/244* (2013.01); *H01J 37/21* (2013.01); *H01J 2237/2448* (2013.01)

(58) Field of Classification Search
CPC .... H01J 37/244; H01J 37/21; H01J 37/24475; H01J 37/2448; H01J 2237/24475; H01J 2237/2448
See application file for complete search history.

(56) References Cited

U.S. PATENT DOCUMENTS

| | | | | |
|---|---|---|---|---|
| 7,135,678 B2* | 11/2006 | Wang | ............... | H01J 37/244 250/310 |
| 7,417,235 B2* | 8/2008 | Schon | ............... | G01N 23/2251 250/397 |
| 8,222,600 B2* | 7/2012 | Zarchin | ............... | H01J 37/244 250/307 |
| 2016/0086765 A1* | 3/2016 | Cheifetz | ............... | H01J 37/08 250/307 |

* cited by examiner

*Primary Examiner* — David E Smith

(57) ABSTRACT

Systems and devices for improving the efficiency of secondary electron detection in charged particle beam systems include a charged particle detector, a first elongate member coupled with the charged particle detector, and a second elongate member coupled with the charged particle detector. The first elongate member and the second elongate member each extend away from the charged particle detector. The system also includes at least one drawing member that is coupled with the first elongate member. Additionally, at least one electrical connection point is arranged to supply at least one bias voltage to the first elongate member, the second elongate member, and the drawing member. The drawing member is configured to generate an electromagnetic field that applies a drawing force that draws charged particles away from the charged particle source, and/or reduces the amount of charged particles from the charged particle source that strike the charged particle tool.

19 Claims, 11 Drawing Sheets

SECONDARY ELECTRON DETECTION EFFICIENCY

BACKGROUND OF THE INVENTION

Charged particle beam systems, such as focused ion beam (FIB) systems are presently used in many areas of science and industry. For example, in the semiconductor industry, FIB systems are used for integrated circuit probe point creation, circuit editing, failure analysis, and numerous other applications. To perform these functions well, it is important that FIB systems have imaging capabilities to enable users to view a grounded sample (i.e., sample, integrated circuit, etc.) that the FIB system is being used to interface with. To achieve such imaging capabilities, some current FIB systems include a secondary electron detector (SED) that utilizes the secondary electrons emitted as a result of the ion beam being incident on the grounded sample to obtain high-resolution images of the grounded sample.

As the processes and components within contemporary integrated circuits continue to get smaller, the imaging capabilities of the FIB systems need to be continuously modified to improve the image resolution of the obtained images. One method of achieving high imaging resolution is to reduce ion beam current, However, reducing the ion beam current results in a reduced quantity of secondary electrons, which limits the resolution of images obtained by the SED. Accordingly, new methods, devices, and systems are desired to improve the resolution of images obtained by the SED by increasing the efficiency at which SED detectors convert the secondary electrons into images.

SUMMARY OF THE INVENTION

Systems and devices for improving the efficiency of secondary electron detection in charged particle beam systems include a charged particle detector, a first elongate member coupled with the charged particle detector, and a second elongate member coupled with the charged particle detector. The first elongate member and the second elongate member each extend away from the charged particle detector. The system also includes at least one drawing member that is coupled with the first elongate member. Additionally, at least one electrical connection point is arranged to supply at least one bias voltage to the first elongate member, the second elongate member, and the drawing member. The drawing member extends away from the first elongate member and toward the second elongate member and is configured to generate an electromagnetic field that applies a drawing force that draws charged particles away from the charged particle source, and/or reduces the amount of charged particles from the charged particle source that strike the charged particle tool.

Moreover, the electromagnetic field generated by the first elongate member, the second elongate members, and the drawing member defines a charged particle flow path within which a majority of charged particles travel from the sample to the charged particle detector. The systems and device may also optionally include at least one path stabilization member that is coupled with the first elongate member at a location between the charged particle detector and the drawing member. The path stabilization member extends away from the first elongate member and toward the second elongate member, and the at least one electrical connection point is further arranged to supply the at least one bias voltage to the path stabilization member. When the bias voltage is applied to the path stabilization member, an electromagnetic field is generated that applies a stabilization force that increases the number of charged particles that remain within a charged particle flow path as the charged particles travel from the sample and to the charged particle detector.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings.

DETAILED DESCRIPTION OF EMBODIMENTS

Systems and devices for improving the efficiency of charged particle detection in charged particle beam systems are disclosed. More specifically, the disclosure includes systems and devices that improve upon prior charged particle guide technology, enabling the generation of high-resolution images of a sample that are otherwise unable to be acquired due to hardware limitations. For example, the technical improvements of the charged particle detector assemblies disclosed herein improve the efficiency of charged particle detection by increasing the number of charged particles that are drawn toward the detector, reducing the number of collisions between charged particles and the sample and/or other structures, and stabilizing the region of the charged particle detector upon which the charged particles are incident.

Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

Figure 1:
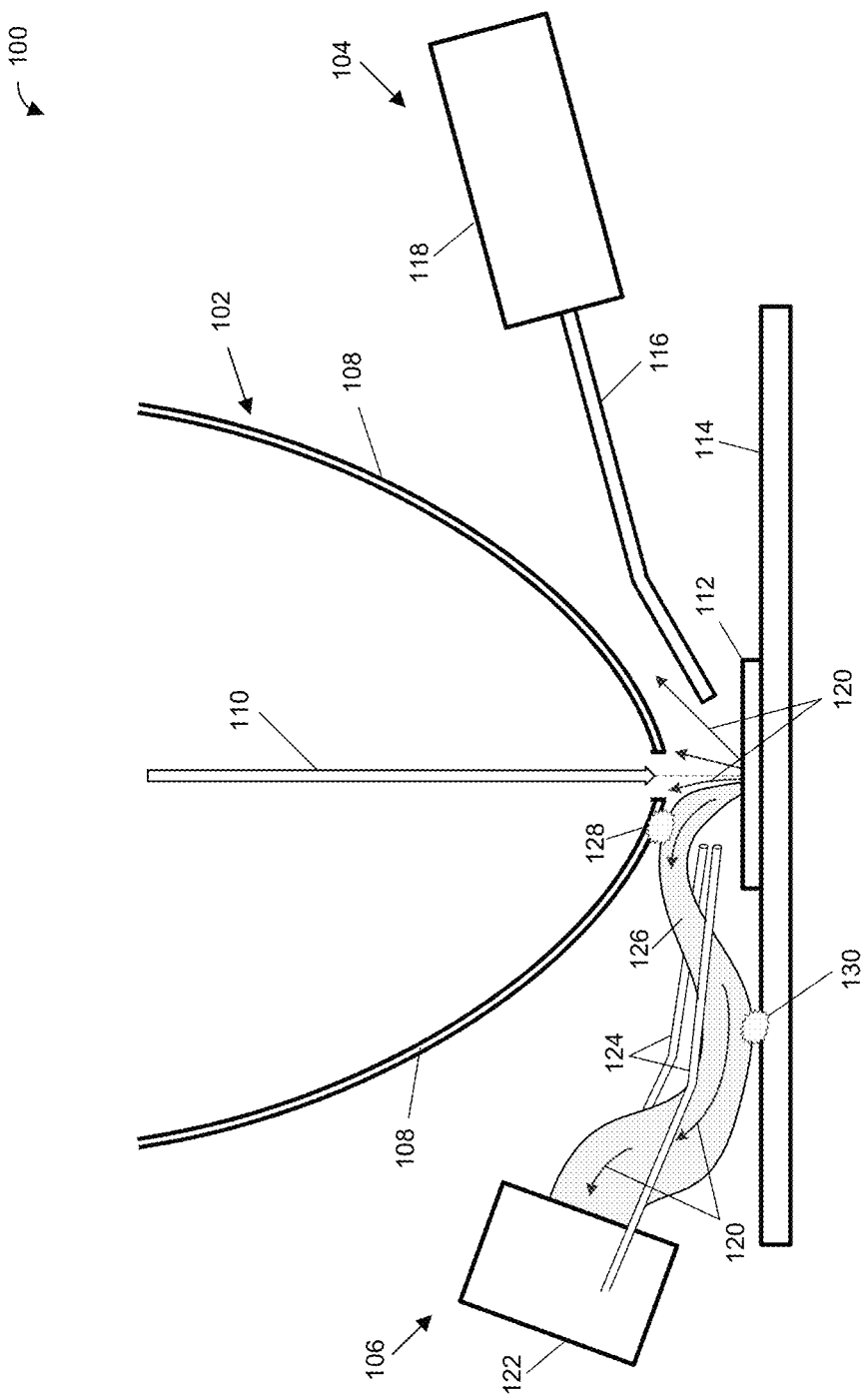
FIG. 1 illustrates an example prior art charged particle beam system.

FIG. 1 is an illustration of an example prior art charged particle beam system 100 that includes a charged particle beam tool 102, a chemistry injection tool 104, and a charged particle detection system 106. The charged particle beam tool 102 includes a column 108 that provides a focused charged particle beam 110 directed towards a sample 112 positioned on a platform 114. To provide the focused charged particle beam 110, the column 108 can include an ion source, optics, and other structure. For example, the column 108 may be a coaxial photon-ion column, which is configured to provide a focused ion beam. The chemistry injection tool 104 is shown as including a chemistry injector tube 116 configured to provide a gas from a chemical repository 118 to the sample 112.

FIG. 1 illustrates a charged particle detection system 106 for detecting charged particles 120 emitted as a result of the focused charged particle beam 110 being incident on the sample 112. Charged particle detection system 106 includes a charged particle detector 122 and a charged particle guide 124. A bias voltage is applied to the charged particle guide 124 that causes the charged particle guide 124 to generate an electric field that applies forces to charged particles 120 and guides the charged particles 120 to the charged particle detector 122. For example, application of a focused ion beam to a sample may also cause emission of positively charged secondary ions. To configure the charged particle guide 124 to collect positively charged secondary ions, a negative bias, at a much higher voltage than for collection of secondary electrons, is applied to the charged particle guide 124. In another example, application of an electron beam tool causes the emission of secondary electrons. A positive bias can be applied to the charged particle guide 124 to attract and guide the secondary electrons to the charged particle detector 122.

In this way, the electric field generated by the charged particle guide 124 defines a charged particle flow path 126 within which a majority of the charged particles 120 travel from the sample 112 to the charged particle detector 122. Unfortunately, in prior art charged particle beam systems 100 many charged particles 120 do not reach the charged particle detector 122 for many reasons, such as the charged particles 120 not being drawn into the charged particle flow path 126, striking the column 108 (e.g. at location 128), striking the platform 114 (e.g. at location 130), striking portions of the sample 112, and striking the charged particle guide 124.

FIGS. 2-17 and 19 provide examples of charged particle beam systems, charged particle detection systems, improved charged particle guide devices, and/or features thereof according to the present disclosure. Elements that serve similar, or at least substantially similar, purpose are labeled with like numbers in each of FIGS. 2-17 and 19, and these elements may not be discussed in detail herein with reference to each of FIGS. 2-17 and 19. Similarly, all elements may not be labeled in each of FIGS. 2-17 and 19, but reference numerals associated therewith may be utilized herein for consistency. Elements, components, and/or features that are discussed herein with reference to one or more of FIGS. 2-17 and 19 may be included in and/or utilized with any of FIGS. 2-17 and 19 without departing from the scope of the present disclosure.

Figure 2:
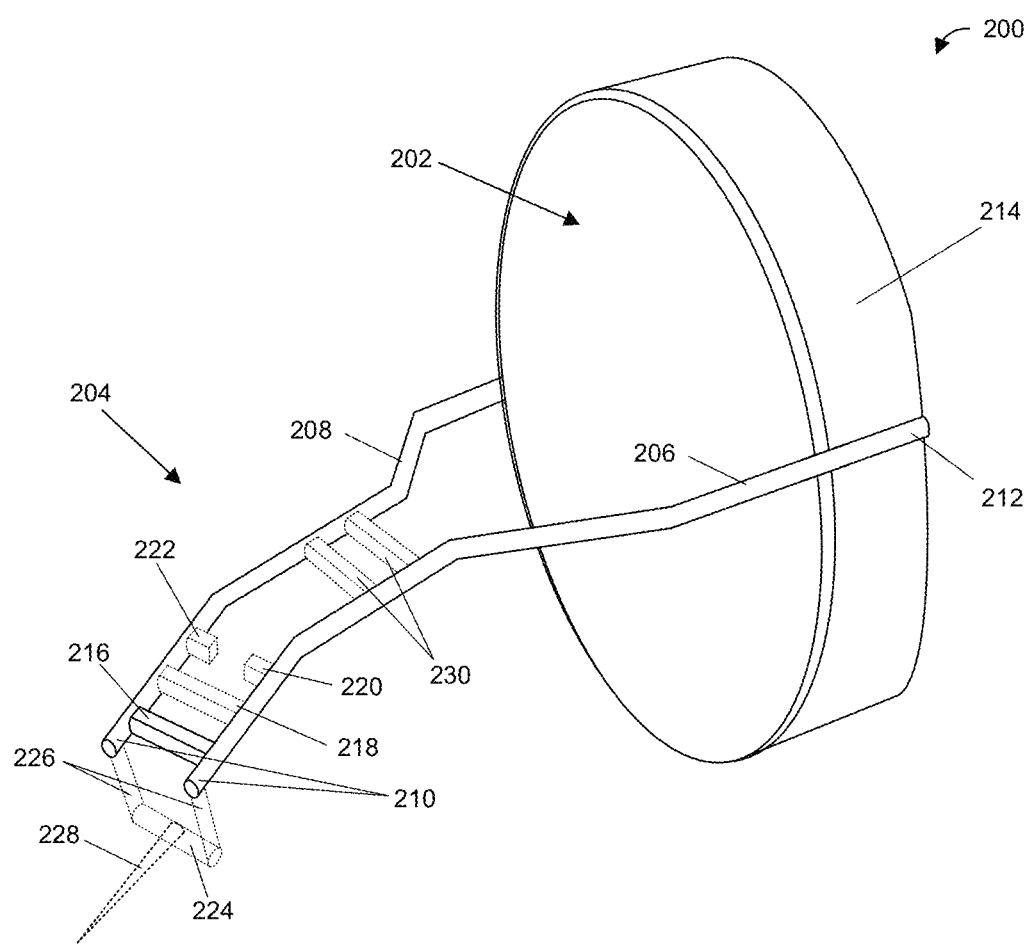
FIG. 2 is a schematic view of example charged particle detector assemblies for improving the efficiency of charged particle detection in charged particle beam systems.

FIG. 2 is a schematic view of example charged particle detector assemblies 200 for improving the efficiency of charged particle detection in charged particle beam systems. Example charged particle detector assemblies 200 include a charged particle detector 202 and an improved charged particle guide 204. According to the present disclosure, the charged particle detector 202 is a sensor device configured to detect charged particles emitted by a sample in response to a focused charged particle beam (e.g., a focused ion beam, an electron beam, etc.) being incident on the sample. The sample can be a biological sample, material sample, device under test (DUT) (e.g., a semiconductor device, an integrated circuit, a transistor component thereof, etc.), or other types of sample. In an embodiment, the charged particle detector 202 can be a secondary electron detector (SED) that is configured to detect secondary electrons that are emitted as a result of a focused ion beam (e.g., a gallium ion beam, helium ion beam, neon ion beam, krypton ion beam, etc.) being incident upon an integrated circuit. For example, the charged particle detector 202 can include an Everhart-Thornley type design using scintillator.

In FIG. 2, the improved charged particle guide 204 is illustrated as being composed of a first elongate member 206 and a second elongate member 208. In some embodiments, the improved charged particle guide 204 may have fewer elongate members or may have one or more additional elongate members. In an embodiment, each elongate member is a wire or rod that is at least partially composed of an electrically conductive material, such as stainless steel, nickel, chromium, platinum, palladium, alloys, etc.

The first elongate member 206 and the second elongate member 208 include a first end 210 and a second end 212 that is opposite the first end 210. In some embodiments, the first end 210 may be positioned adjacent to the sample being examined with a charged particle beam system and/or the path through which the focused charged beam passes before it is incident on the sample. For example, the first end 210 of each of the first elongate member 206 and the second elongate member 208 may be positioned within 1 mm of the path through which a focused ion beam passes through before it is incident on a DUT. Alternatively, the first elongate member 206 and the second elongate member 208 may be trimmed back so that the first end 210 is a further distance removed from the path of the focused charged beam (e.g., 0.5 mm, 1 mm, 1.905 mm, 2 mm, 5 mm from the path of the focused charged beam). The second end 212 can be mechanically coupled to the charged particle detector 202 via a coupling body 214. For example, FIG. 2 shows the first elongate member 206 and the second elongate member 208 as being welded to a ring structure which is adapted to be fastened around the charged particle detector 202.

When a bias voltage is applied to the first elongate member 206 and the second elongate member 208, an electric field is created that attracts charged particles from a charged particle source and toward the charged particle detector 202. For example, the electric field can apply an attractive force to attract secondary electrons emitted when a focused charged particle beam is incident on a sample towards the charged particle detector 202. In this way, the electric field generated by the first elongate member 206 and the second elongate member 208 defines a charged particle flow path within which a majority of the charged particles emitted as a result of a focused charged beam being incident on the sample travel from the sample to the charged particle detector 202. The voltage applied to one or more of the elongate members may vary depending on the geometry of the charged particle guide 204 and/or charged particle beam system.

FIG. 2 further illustrates the charged particle guide 204 including a drawing member 216. The drawing member 216 is shown as being coupled with each of the first elongate member 206 and the second elongate member 208. FIG. 2 further shows the charged particle guide 204 as optionally including one or more additional drawing members (i.e., 218, 220, 222, and 224). In various embodiments, individual drawing members 216-224 can be a wire, a rod, a bar, a plate, a sheet, a piece of tape, or a combination thereof. The individual drawing members 216-224 are electrically conductive. For example, drawing member 216 is shown as an electrically conductive rod that projects radially outward from a first coupling point on the first elongate member 206 and to a second coupling point on the second elongate member 208. In another example, a drawing member can be a portion of conductive tape that is welded and/or adhesively coupled to one or more elongate structures. The drawing members 216-224 can be at least partially composed of an electrically conductive material, such as stainless steel, nickel, chromium, platinum, palladium, alloys, etc. Individual ones of drawing members 216-224 can be composed of the same material and/or collection of materials as the elongate members, or they may be composed of a different material and/or collection of materials.

In FIG. 2, drawing member 216 is shown as a straight rod. However, in other embodiments, drawing member 216 or any of the additional drawing members 218-224 may be curvilinear, arcuate, and/or have one or more angles, corners, or bends. For example, a drawing member may have a midpoint segment that comprises a bend, such that the drawing member has the overall shape of a chevron with the point of the chevron leading in a direction toward the charged particle detector 202, away from the charged particle detector 202, toward the sample, toward the charged particle source, or in another direction. Alternatively, or in addition, a drawing member may be curvilinear such that the distance from the focused charge beam and/or location where the focused charge beam is incident on the sample is uniform across the drawing member.

When a bias voltage is applied to the drawing member 216 and/or the additional drawing members, an electric field is created that attracts charged particles away from the surface of the sample from which the charged particles are being emitted and/or reflected. For example, the electric field generated by the drawing member 216 can apply a drawing force to secondary electrons emitted by a DUT in a direction away from the surface of the DUT and/or towards the drawing member 216. In various embodiments, the drawing member 216 and/or additional drawing members can be electrically connected to one or both of the first elongate member 206 and the second elongate member 208. In such an embodiment, the bias voltage applied to the drawing member 216 and/or additional drawing members is the same as the bias voltage applied to one or both of the first elongate member 206 and the second elongate member 208. Alternatively, or in addition, individual ones of the drawing members can be electrically insulated from one or more elongate members and/or other drawing members. In such an embodiment, a different bias voltage may be applied to the insulated drawing member than to the one or more elongate members and/or other drawing members from which it is insulated.

The drawing member 216 and the additional drawing members are rigidly coupled (e.g., via welding, adhesion, a mechanical coupling, etc.) to the first elongate member 206 and/or the second elongate member 208. For example, the drawing member 216 and optional additional drawing member 218 are illustrated in FIG. 2 as being directly coupled to each of the first elongate member 206 and the second elongate member 208. In such an arrangement, the drawing member 216 can act as a conductive bridge that electrically connects the first elongate member 206 to the second elongate member 208. The drawing member 216 is shown as being coupled at a location proximate to the first end 210 of the elongate members (e.g., at a location within 0.05 mm, 1 mm, 2 mm, and/or 5 mm of the first end 210). In various embodiments, the locations at which the drawing member 216 and/or the additional drawing members are coupled to the elongate members can be selected so that the electric field created by the drawing member 216 and/or the additional drawing members applies a more optimal drawing force to charged particles emitted as a result of a focused charged beam being incident on the grounded sample. That is, the drawing member 216 and/or the additional drawing members may be coupled to the elongate members at locations that improve the efficiency that such charged particles are attracted to the charged particle detector 202. For example, in an embodiment where the elongate members are trimmed back such that the first ends 210 are 1.905 mm removed from the path of the focused charged beam, the drawing member 216 may be coupled at a location on the elongate members that is 2.35 mm from the path of the focused charged beam. In another embodiment, the drawing member 216 may be coupled to the first end 210 of the elongate structures.

In FIG. 2 additional drawing member 220 is shown as being coupled to only the first elongate member 206 and additional drawing member 222 is shown as being coupled to only the second elongate member 208. Each of the drawing members 216-224 are illustrated as projecting radially outward from corresponding elongate members in a direction perpendicular to an axis of the corresponding elongate members. For example, the additional drawing member 220 and the additional drawing member 222 are illustrated as each projecting from a corresponding elongate member symmetrically toward each other. However, in other embodiments, one or more of the drawing members 216-224 may project outward from a corresponding elongate member at an angle towards or away from the charged particle detector 202. In another embodiment according to the present disclosure, one or more drawing member 216-224 may be a component element of the first elongate member 206 and/or the second elongate member 208. For example, in some embodiments, one or more elongate members and the drawing member 216 may be manufactured as a single continuous structure, where the drawing member 216 is an arm that projects from the one or more elongate members.

FIG. 2 further illustrates optional additional drawing member 224 as being coupled to the first elongate member 206 and the second elongate member 208 by attachment members 226. This allows the additional drawing member 224 to be positioned closer than the first end 210 of the elongate structures to the sample being examined with a charged particle beam system, the platform upon which the sample rests, and/or the path through which the focused charged beam passes before it is incident on the sample. Alternatively, the attachment members 226 may allow the additional drawing member 224 to be positioned in a different location so that the electric field generated by the drawing member 224 provides a more optimal drawing force to the charged particles emitted as a result of a focused charged beam being incident on the grounded sample. While additional drawing member 224 is shown as being coupled to each of the first elongate member 206 and the second elongate member 208, in some embodiments, the additional drawing member 224 can be coupled to a single elongate member via a single attachment member 226. The attachment members 226 can be made of the same material/combination of materials as the drawing member 216, the elongate members, and/or both. In some embodiments, one or more of the attachment members 226 may be at least partially electrically conductive, so as to form an electrical bridge between the drawing member 224 and at least one elongate member.

Additionally, FIG. 2 further illustrates the example charged particle guide 204 as optionally including a projection member 228. While projection member 228 is shown as being coupled to and/or an integrated component of additional drawing member 224, in other embodiments, the projection member 228 can be coupled to and/or an integrated component of drawing member 216. Projection member 228 can be an electrically conductive cone, cylinder, horn, wire or other type of projection. The projection member 228 extends away from the drawing member to which it is coupled, and toward one or more of the sample being examined with a charged particle beam system, the platform upon which the sample rests, and/or the path through which the focused charged beam passes before it is incident on the sample.

Charged particle guide 204 optionally include one or more stabilization members 230 coupled to one or more elongate members. For example, FIG. 2 shows two stabilization members 230 that are each coupled to the first elongate member 206 and the second elongate member 208. The one or more stabilization members 230 are coupled between the drawing member 216 and the charged particle detector 202. As noted above, the elongate members generate an electric field that creates a charged particle flow path within which a majority of the charged particles emitted as a result of a focused charged beam being incident on the sample travel from the sample to the charged particle detector 202. When a bias voltage is applied to the one or more stabilization members 230 an electric field is created that applies a stabilization force to charged particles that causes an increased number of charged particles to travel within the flow path. That is, the stabilization force influences the charged particles to travel within the flow path, thus limiting the number of electrons that collide with a portion of a charged particle beam tool, that collide with the sample, that collide a platform that supports the sample, that collide with elongate member 206 and/or 208, or whose momentum carries them outside of the flow path. For example, the electric field generated by the one or more stabilization members 230 can apply a stabilization force to secondary electrons emitted by a DUT that modifies the momentum of the secondary electrons such that a larger number of the secondary electrons travel within the flow path to the charged particle detector 202.

Figure 3:
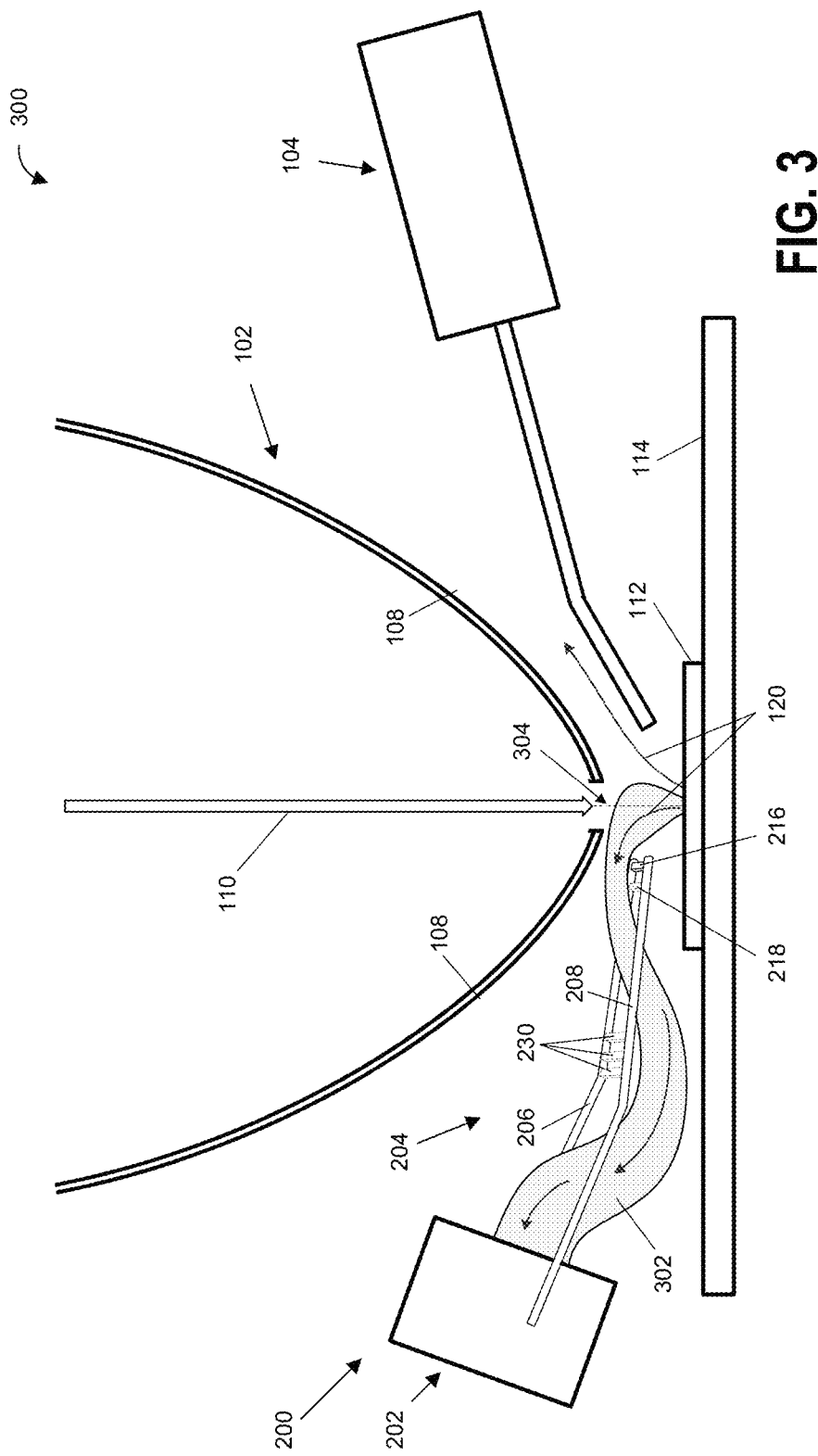
FIG. 3 illustrates an example charged particle beam system that includes an improved charged particle guide according to the present disclosure.

FIG. 3 is an illustration of an example charged particle beam system 300 that includes charged particle beam tool 102, chemistry injection tool 104, and a charged particle detector assembly 200 that includes a charged particle detector 202 and an improved charged particle guide 204. When one or more bias voltages are applied to the improved charged particle guide 204 an electric field is created that attracts charged particles 120 emitted as a result of a focused charged beam 110 being incident on the sample 112 travel from the sample 122 to the charged particle detector 202.

Specifically, when one or more bias voltages are applied to the improved charged particle guide 204 the first elongate member 206 and the second elongate member 208 create an electric field that applies an attractive force to attract charged particles 120 emitted when a focused charged particle beam 110 is incident on sample 112 towards the charged particle detector 202. This attractive force causes a portion of the charged particles to travel from the sample 112 to the charged particle detector 202 within flow path 302. Additionally, when the one or more bias voltages are applied to the drawing member 216 and/or the additional drawing member 218, an electric field is generated that applies a drawing force to the charged particles 120 in a direction away from the surface of sample 112 and/or towards the drawing members 216 and 218. In this way, the drawing member 216 and/or the additional drawing member 218 cause an increased number of the charged particles 120 to flow toward the charged particle detector 202 within the flow path 302.

Moreover, when the one or more bias voltages are applied to the optional stabilization members 230, an electric field is generated that applies a stabilization force to the charged particles 120 that modifies the momentum of the charged particles 120 such that fewer charged particles 120 collide with the column 108, collide with the sample 112, collide a platform 114, or travel outside of the flow path 302. This causes an increased number of charged particles 120 to travel within the flow path 302 to the charged particle detector 202, which in turn enhances the resolution of the images that can be obtained by the charged particle detector 202.

In various embodiments of the improved charged particle guide 204, the positions of the drawing member 216, additional drawing member 218, and one or more stabilization members 230, may be selected such that the drawing force and the stabilization force cause an optimal amount of charged particles 120 to flow from the sample 112 to the charged particle detector 202. For example, in a certain embodiment, the drawing member 216 is positioned 1.905 mm from the centerline 304 of the charged particle beam tool 102, while the additional drawing member 218 is positioned 2.64 mm from the centerline 304. In such an embodiment, a first stabilization member 230 may be positioned 7.992 mm from the centerline 304, a second stabilization member 230 may be positioned 8.964 mm from the centerline 304, and a third stabilization member 230 may be positioned 9.983 mm from the centerline 304. The optimal positioning of and bias voltages to be applied to each of the drawing member 216, additional drawing member 218, and one or more stabilization members 230 will differ depending on the geometry (e.g., shape, scale, positioning, orientations, size, etc.) and characteristics (e.g., type of charged particle tool, current of the focused charged particle beam, etc.) charged particle beam system 300.

FIGS. 4-17 are schematic diagrams of example particle guide devices according to the present disclosure. However, the invention of the present disclosure is not limited to the example embodiments shown in FIGS. 4-17. Rather, they are merely introduced to show examples of how the elements, components, and/or features described in the present disclosure may be implemented. Accordingly, a person having skill in the art would understand that the elements components, and/or features that are discussed herein with reference to one or more of FIGS. 2-17 may be included in and/or utilized with any of FIGS. 4-17 without departing from the scope of the present disclosure.

Figure 4:
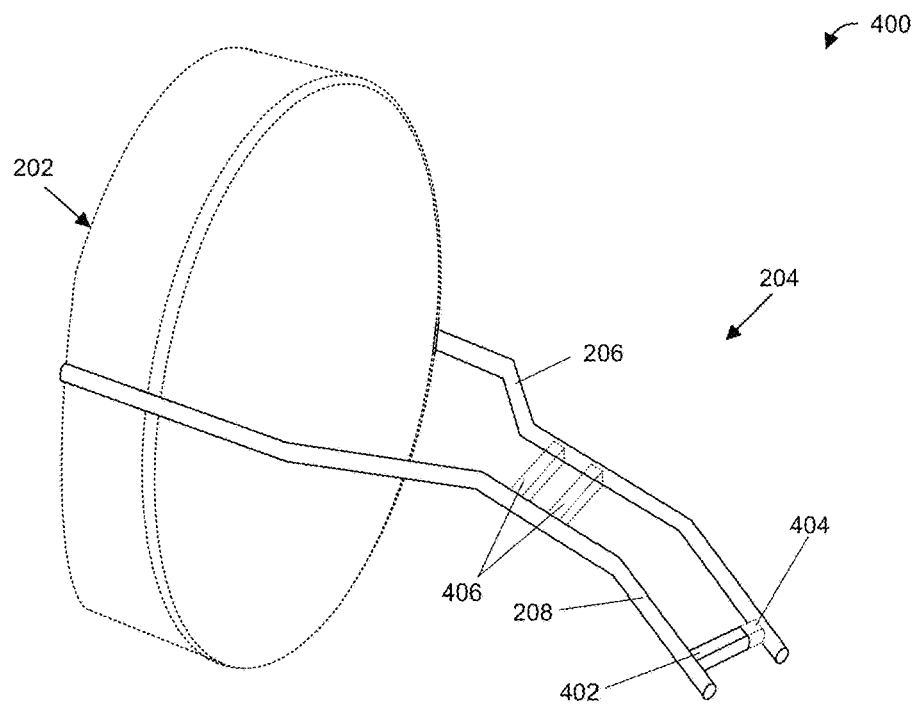
FIG. 4 is a schematic view of an example improved charged particle guide that includes a drawing member coupled with the second elongate member.

Specifically, FIGS. 4-17 illustrate an example improved charged particle guide 204 that may optionally be coupled to a charged particle detector 202. FIG. 4 illustrates an example improved charged particle guide 400 that includes a drawing member 402 coupled with the second elongate member 208. The drawing member 402 extends away from the second elongate member 208 and toward the first elongate member 206. FIG. 4 further illustrates that the drawing member 402 may optionally extend 404 so that it is also physically coupled to the first elongate member 206. Two optional stabilization members 406 are shown as being coupled to the elongate members at positions between the drawing member 402 and the charged particle detector 202.

Figure 5:
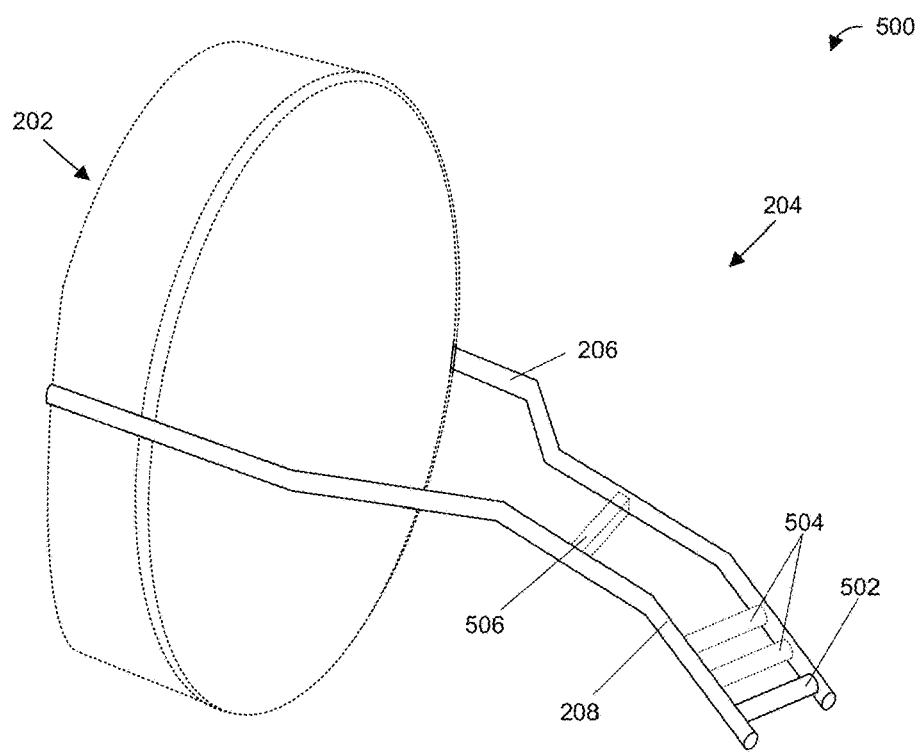
FIG. 5 is a schematic view of an example improved charged particle guide that includes a cylindrical drawing member coupled with the elongate members.

FIG. 5 illustrates an example improved charged particle guide 500 that includes a cylindrical drawing member 502 coupled with the elongate members. FIG. 5 further illustrates that the multiple optional cylindrical drawing members 504 coupled to the first elongate members. An optional stabilization member 506 is shown as being coupled to the elongate members at a position between the drawing members 502 and 504 and the charged particle detector 202.

Figure 6:
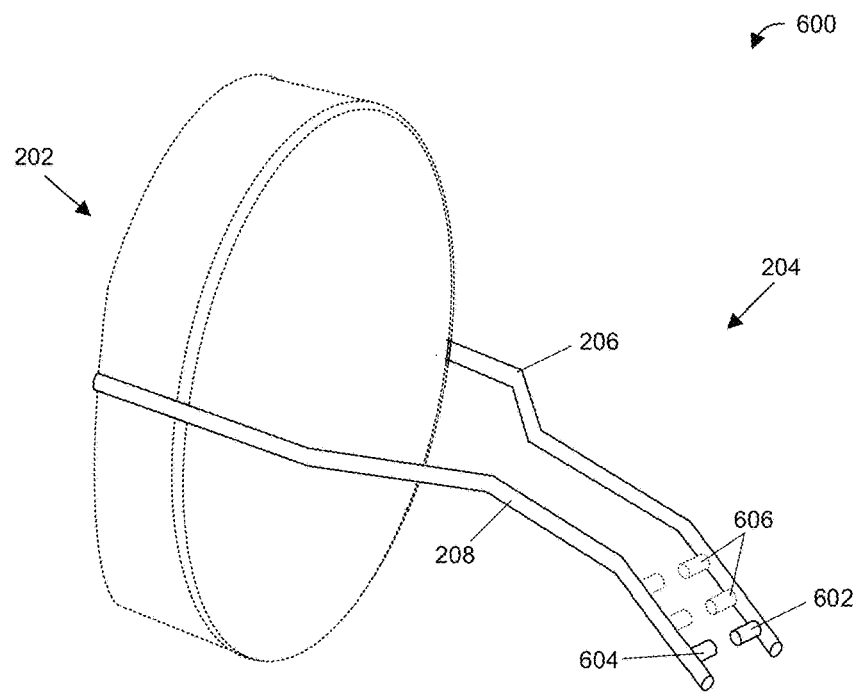
FIG. 6 is a schematic view of an example improved charged particle guide that includes two symmetrical drawing members coupled to separate elongate members.

FIG. 6 illustrates an example improved charged particle guide 600 that includes two symmetrical drawing members coupled to separate elongate members. Drawing member 602 is coupled to the first elongate structure 206 and drawing member 604 is coupled to the second elongate structure 208. While drawing members 602 and 604 are shown as extending towards each other, in other embodiments the drawing members 602 and 604 may extend in other directions. For example, the drawing members 602 and 604 may extend partially or directly toward the charged particle detector 202, a sample, a focused charge beam. FIG. 6 further illustrates multiple optional pairs of drawing members 606 coupled to the elongate members.

Figure 7:
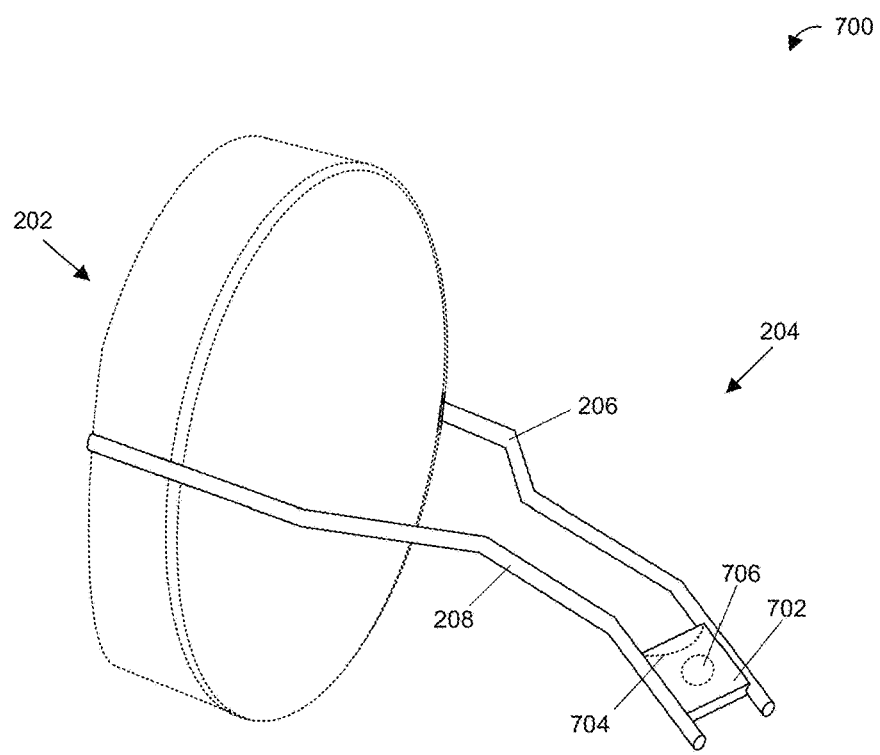
FIG. 7 is a schematic view of an example improved charged particle guide that planar drawing member coupled with the elongate members.

FIG. 7 illustrates an example improved charged particle guide 700 that planar drawing member coupled with the elongate members. Drawing member 702 is a conductive plate that includes a first side that is coupled to the first elongate structure 206 and a second side opposite the first side that is coupled to the second elongate structure 208. The drawing member 702 may be a conductive plate, a conductive sheet, a piece of conductive tape, etc. In FIG. 7 the drawing member 702 is shown as being rectilinear. However, in some embodiments, the drawing member 702 may have curved sides 704 and/or one or more cutouts 706.

Figure 8:
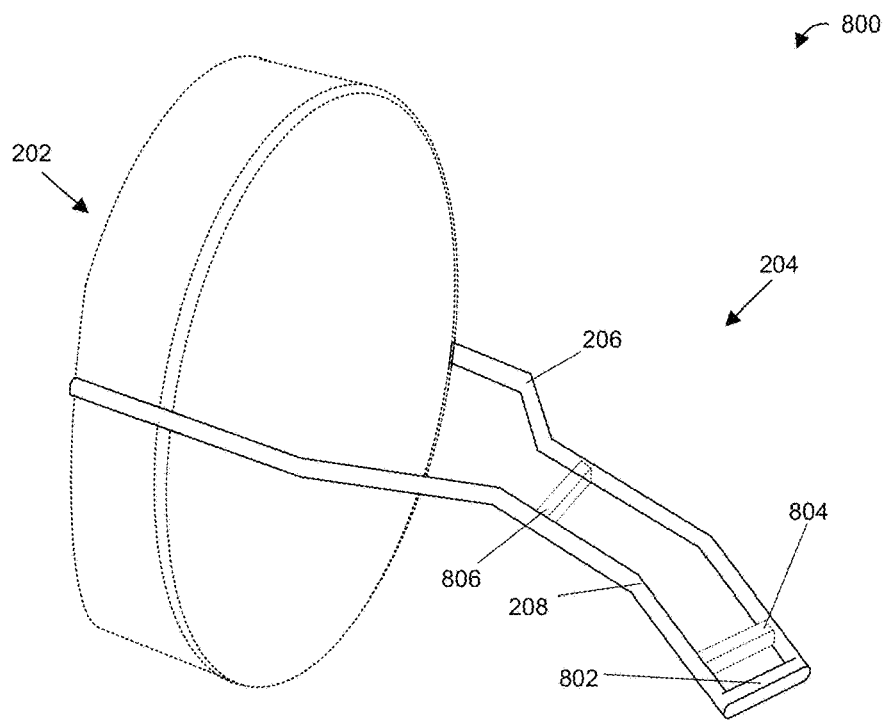
FIG. 8 is a schematic view of an example improved charged particle guide that drawing member coupled with an end of the elongate members.
Figure 9:
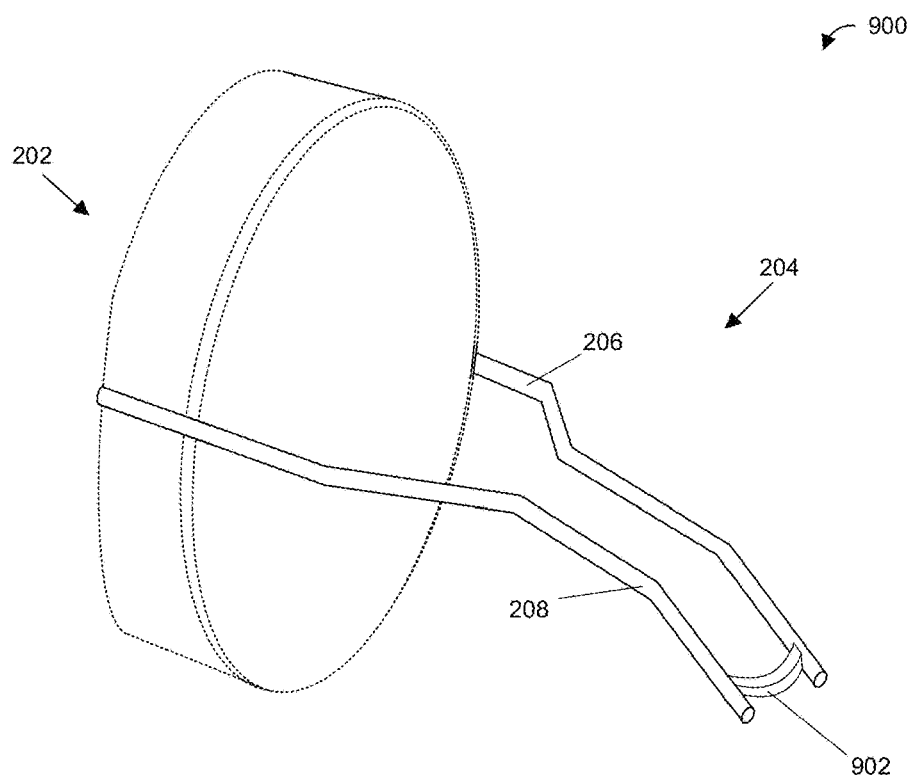
FIG. 9 is a schematic view of an example improved charged particle guide having a curvilinear drawing member pointing.

FIG. 8 illustrates an example improved charged particle guide 800 that drawing member coupled with an end of the elongate members. Drawing member 802 is coupled to an end of each of the first elongate member 206 and the second elongate member 208 that is opposite the charged particle detector 202. FIG. 8 further illustrates an optional additional drawing member 804 and an optional stabilization member 806. FIG. 9 illustrates an example improved charged particle guide 900 having a curvilinear drawing member pointing. Drawing member 902 is illustrated as having a curved shape.

Figure 10:
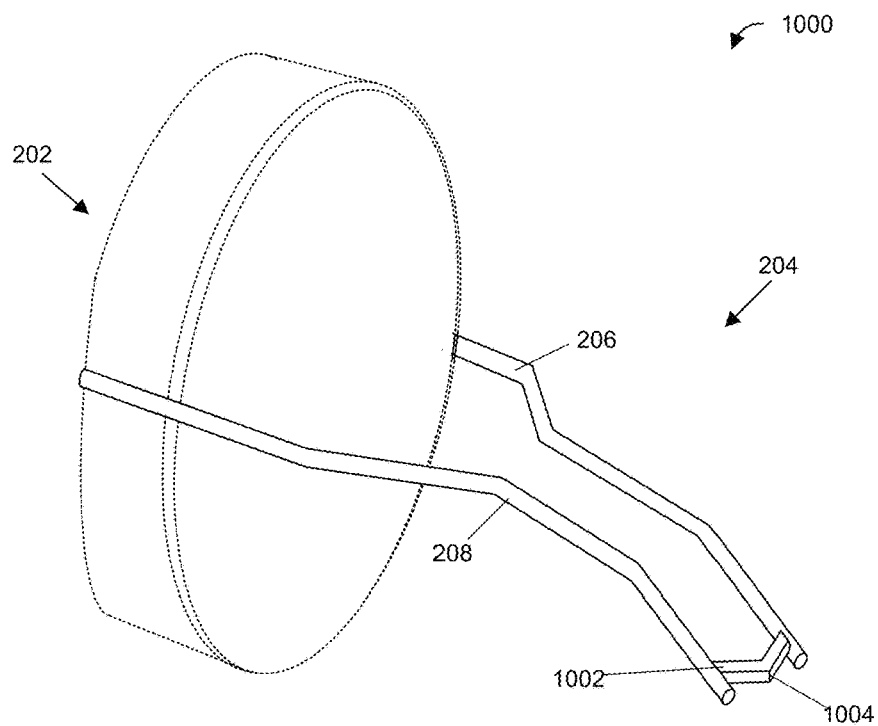
FIG. 10 is a schematic view of an example improved charged particle guide having a chevron shaped drawing member pointing away from a charged particle detector.
Figure 11:
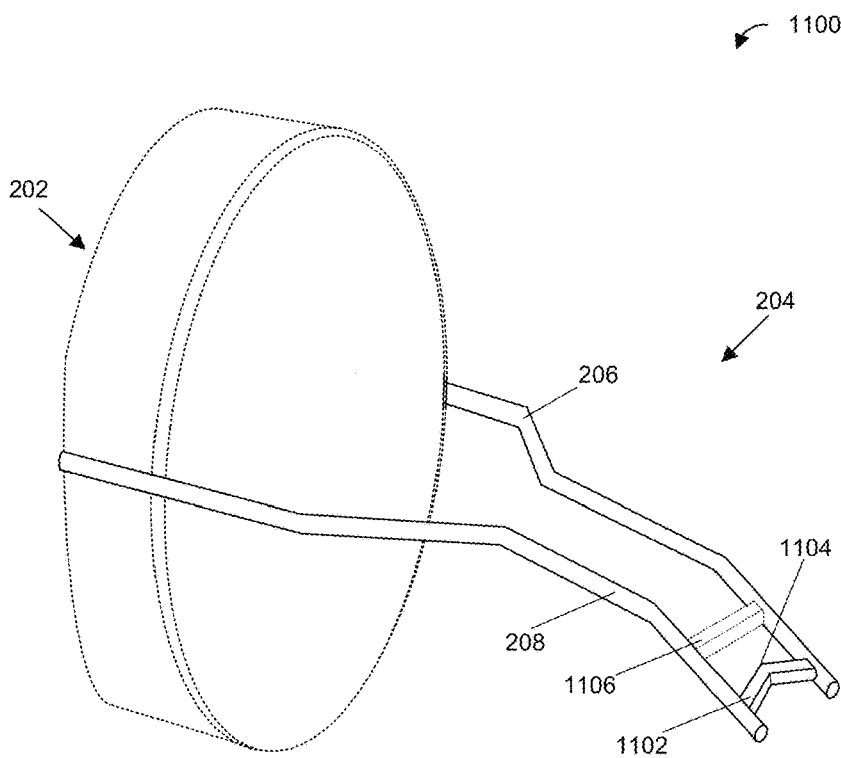
FIG. 11 is a schematic view of an example improved charged particle guide having a chevron shaped drawing member pointing toward a charged particle detector.
Figure 12:
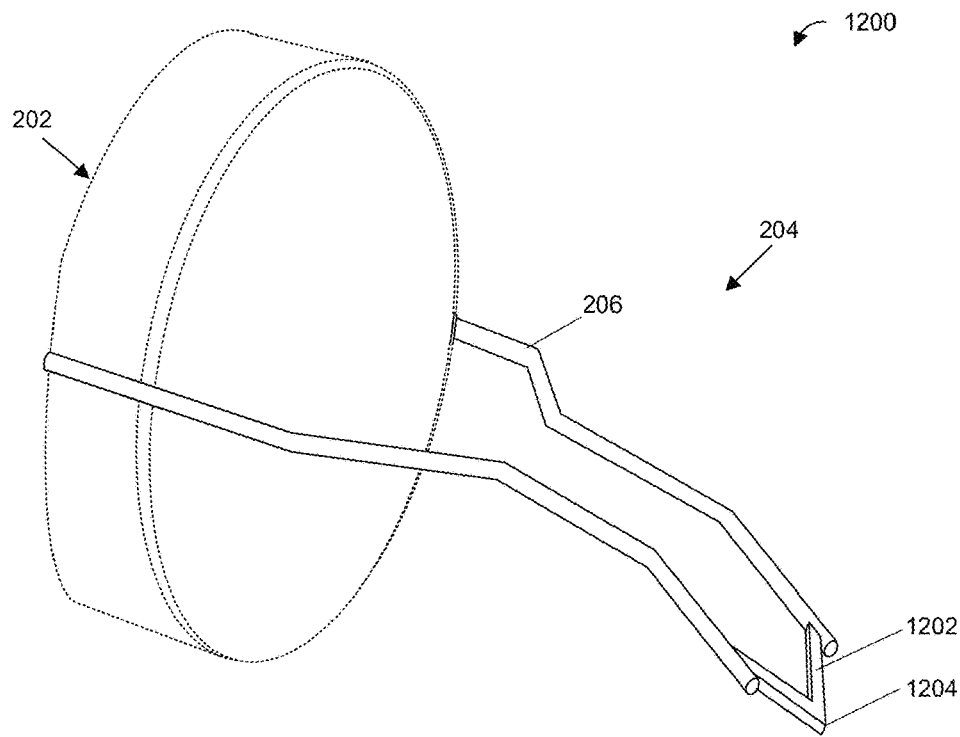
FIG. 12 is a schematic view of an example improved charged particle guide having a chevron shaped drawing member pointing toward a sample.

FIGS. 10-12 illustrate example improved charged particle guides having a chevron shaped drawing member. FIG. 10 illustrates an example improved charged particle guide 1000 having a chevron shaped drawing member 1100 pointing away from a charged particle detector. Drawing member 1002 has a bend 1004 that causes the drawing member 1002 to have a substantially chevron shape. FIG. 11 illustrates an example improved charged particle guide 1100 having a chevron shaped drawing member 1102 pointing toward a charged particle detector. Drawing member 1102 has a bend 1104 that causes the drawing member 1102 to have a substantially chevron shape. FIG. 12 illustrates an example improved charged particle guide 1200 having a chevron shaped drawing member 1202 pointing toward a sample. Drawing member 1202 has a bend 1204 that causes the drawing member 1102 to have a substantially chevron shape. In other embodiments, the drawing members 1002, 1102, and 1202 may have one or more additional bends. FIG. 11 further illustrates an optional additional drawing member 1106.

Figure 13:
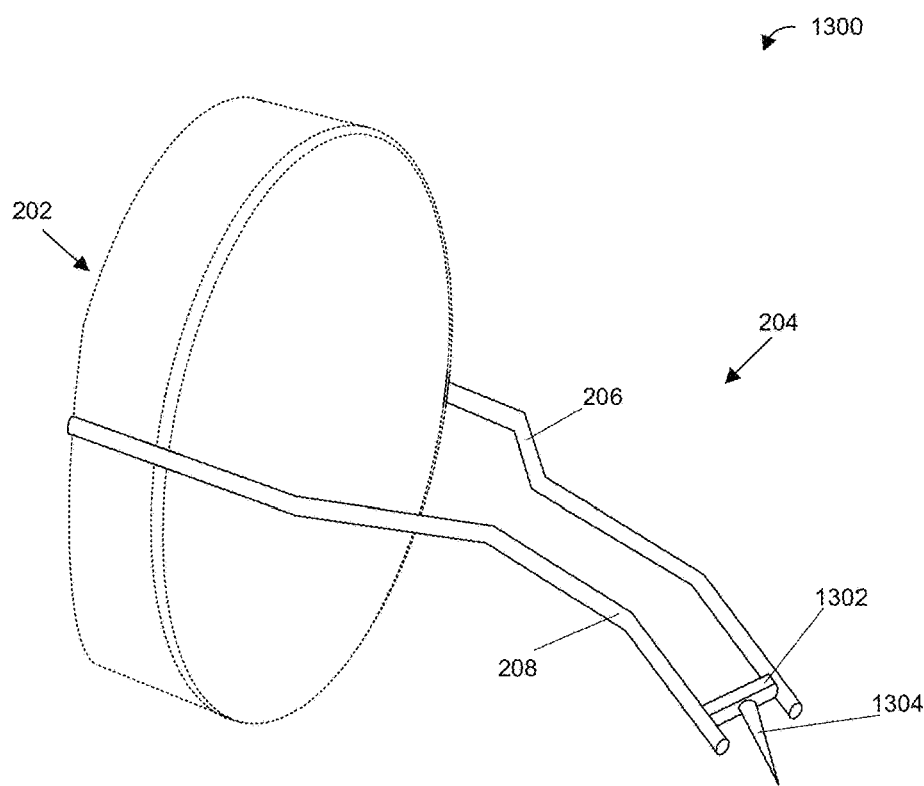
FIG. 13 is a schematic view of an example improved charged particle guide that includes a drawing member with a conductive projection member.

FIG. 13 illustrates an example improved charged particle guide 1300 that includes a drawing member 1302 with a conductive projection member 1304. The projection member 1302 is coupled to and/or a component element of the drawing member 1302. The projection member 1302 can extend from the drawing member 1302 towards a sample, a focused charge beam, or in a different direction.

Figure 14:
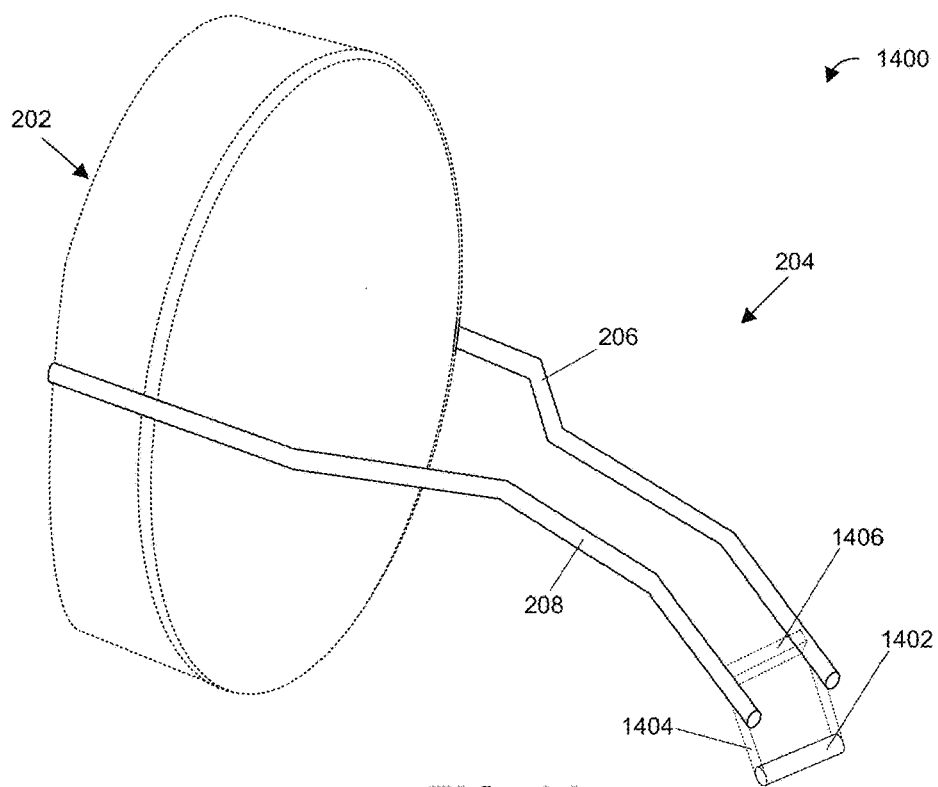
FIG. 14 is a schematic view of an example improved charged particle guide that includes a drawing member coupled with the elongate members via one or more attachment members.

FIG. 14 illustrates an example improved charged particle guide 1400 that includes a drawing member 1402 coupled with the elongate members via one or more attachment members. The drawing member 1402 extends away from the second elongate member 208 and toward the first elongate member 206. This allows the drawing member 1402 to be positioned so that the electric field it generates provides a more optimal drawing force. While drawing member 1402 is shown as being coupled to each of the first elongate member 206 via an attachment member 1404 and the second elongate member 208 via a different attachment member 1404, in some embodiments, the additional drawing member 1402 can be coupled to a single elongate member via a single attachment member 1404. The attachment members 1404 can be made of the same material/combination of materials as the drawing member 1402, the elongate members, and/or both. In some embodiments, one or more of the attachment members 1404 may be at least partially electrically conductive, so as to form an electrical bridge between the drawing member 1402 and at least one elongate member. FIG. 14 further illustrates an optional drawing member 1406 coupled to the elongate members.

Figure 15:
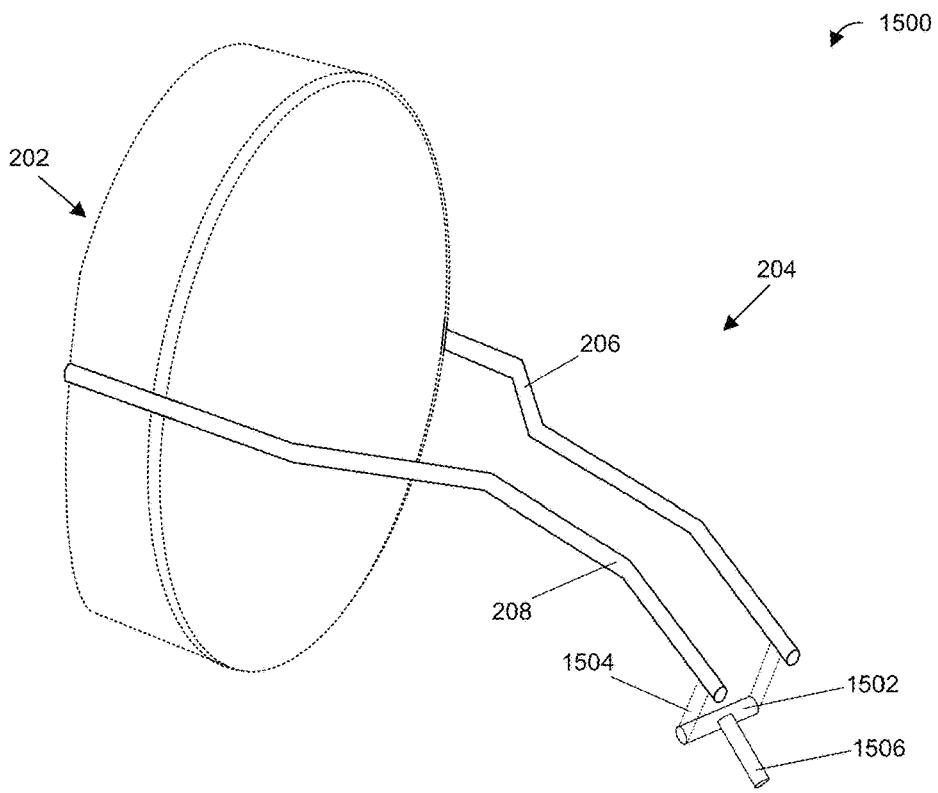
FIG. 15 is a schematic view of an example improved charged particle guide that a drawing member coupled with the elongate members via one or more attachment members and having a projection member.
Figure 16:
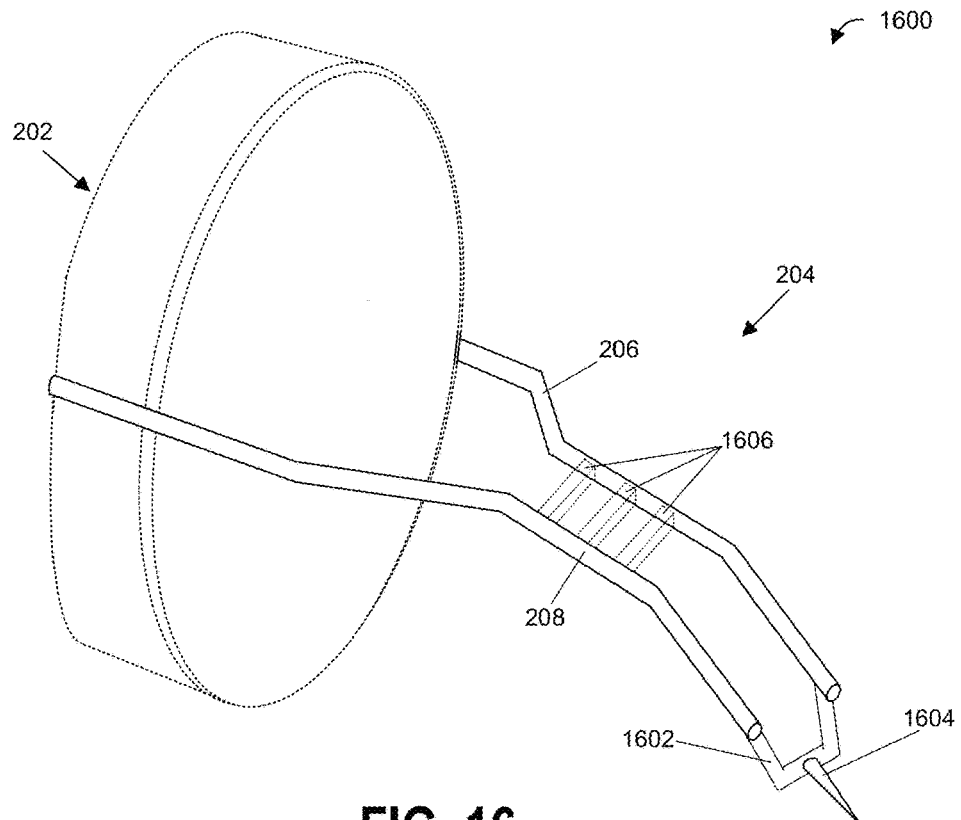
FIG. 16 is a schematic view of an example improved charged particle guide that includes a drawing member having a projection member.

FIG. 15 illustrates an example improved charged particle guide 1500 that a drawing member 1502 coupled with the elongate members via one or more attachment members 1504 and having a projection member 1506. FIG. 16 illustrates an example improved charged particle guide 1600 that includes a drawing member 1602 having a projection member 1604. Drawing member 1602 is shown as having two bends and extending from the elongate members and toward a sample being examined with a charged particle beam system, the platform upon which such a sample rests, and/or the path through which the focused charged beam passes before it is incident on the sample. The projection member 1604 is illustrated as a conductive cone.

Figure 17:
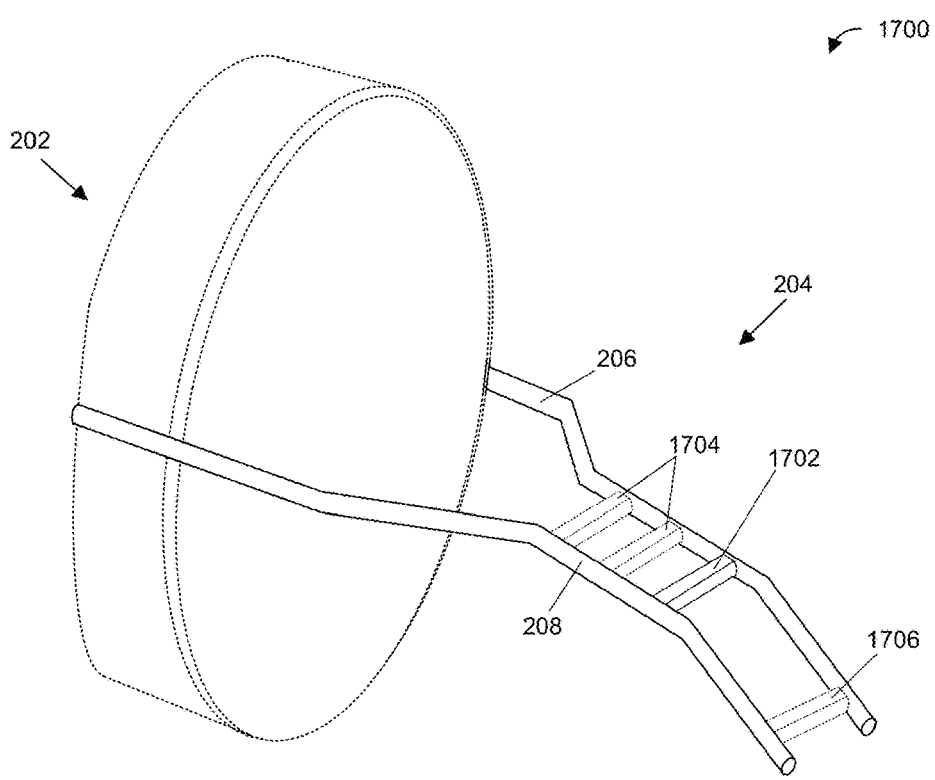
FIG. 17 is a schematic view of an example improved charged particle guide that includes a stabilization member.

FIG. 17 illustrates an example improved charged particle guide 1700 that includes a stabilization member 1702. The stabilization member 1702 coupled to one or more elongate members and positioned so that the electric field created by the stabilization member 1702 applies a stabilization force that causes an increased number of charged particles to travel within a charged particle source and the charged particle detector 202. FIG. 17 further illustrates a plurality of optional additional stabilization members 1704 and an optional drawing member 1706 coupled to the elongate members.

Figure 18:
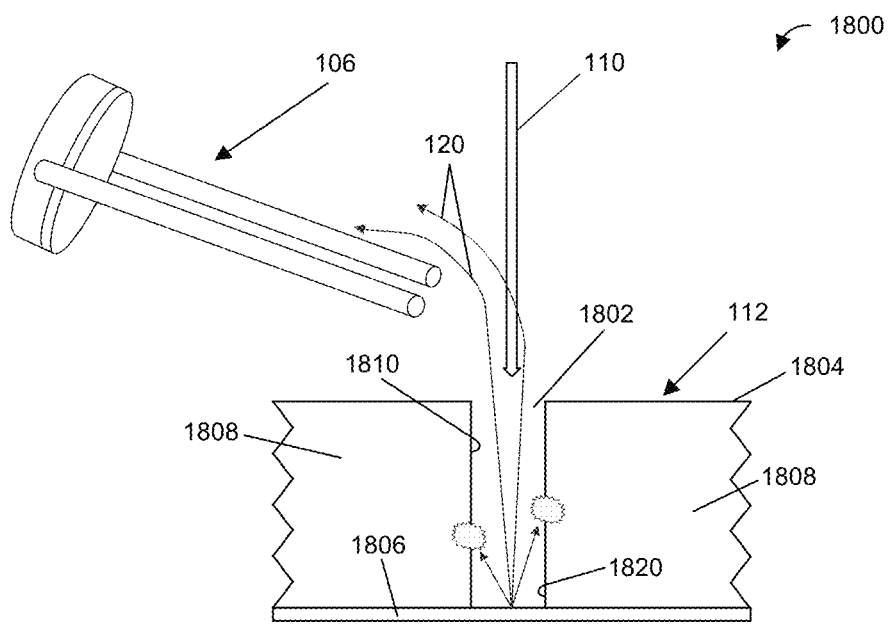
FIG. 18 illustrates the detection of charged particles emitted from within a hole by a prior art charged particle beam system.
Figure 19:
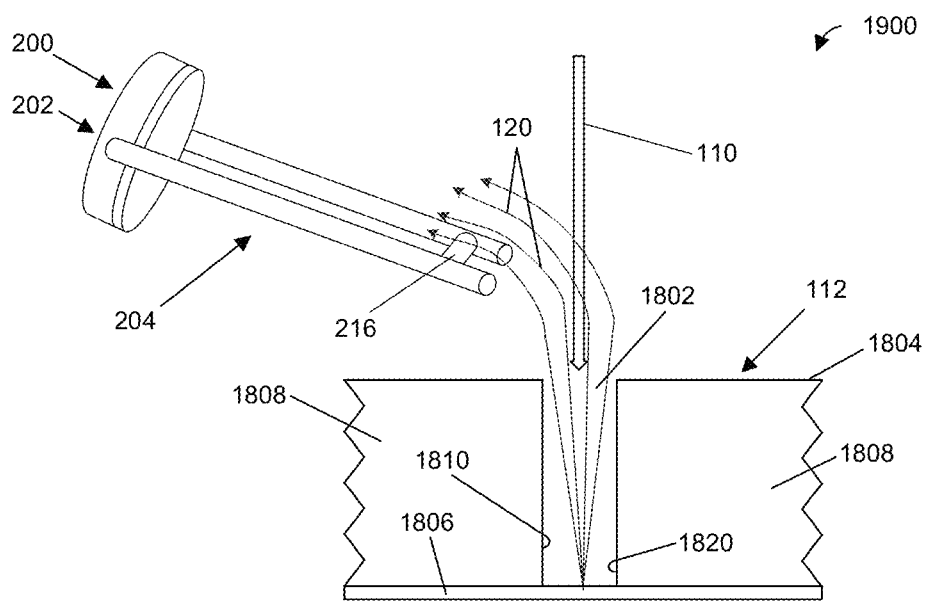
FIG. 19 illustrates the detection of charged particles emitted from within a hole by a charged particle beam system that includes an example improved charged particle guide.

In addition to improving the efficiency that charged particles emitted by the surface of a sample are detected by a charged particle detector, the improved charged particle guides 204 disclosed herein also improve the efficiency that charged particles emitted from within a hole and/or via are detected. FIGS. 18 and 19 illustrate the detection of charged particles emitted from within a hole by a prior art charged particle beam system, and a charged particle beam system that includes an example charged particle guide 204, respectively.

FIGS. 18 and 19 show a focused charge beam 110 being directed to mill a high aspect ratio hole 1802 into a sample 112. For example, the focused charge beam 110 may be a focused ion beam that is being directed to mill a hole 1802 in an integrated circuit 1804. The integrated circuit 1804 is shown as including a metal layer 1806 and an upper layer 1808 through which the focused charge beam 110 is being used to mill a hole through to reach the metal layer 1806. In such a milling operation, the "end point" occurs when the focused charge beam 110 is incident on the metal layer 1806. When the focused charge beam 110 is incident on the metal layer 1806, the focused charge beam 110 causes a quantity of charged particles 120 to be emitted. Detection of this quantity of electrons 120 can be used as evidence of the milling operation's "end point" having occurred, signaling that the milling operation should be stopped.

FIG. 18 is a diagram illustrating the detection of charged particles 120 emitted from within a hole by a prior art charged particle beam system 1800. It can be seen that, while some of the charged particles 120 are collected by the prior art charged particle detection system 106, a portion of the charged particles 120 are not detected because they strike the sidewalls 1810 of the hole 1802. FIG. 19 is a diagram illustrating the detection of charged particles emitted from within a hole by a charged particle beam system 1900 that includes an example improved charged particle guide 204. As can be seen in FIG. 19, the example improved charged particle guide 204 increases the efficiency that the charged particles 120 emitted from within the hole 1802 reach the charged particle detector 202. This is because the electric field created when a bias voltage is applied to the drawing member 216 applies a drawing force to the charged particles 120 in a direction away from the metal layer 1806. This causes the charged particles 120 to move in a direction more perpendicular to the surface of sample 112 and/or bottom surface of the hole 1802, which reduces the number of charged particles 120 that strike the sidewalls 1810 of the hole 1802. Because more of the charged particles 120 emitted when the focused charge beam 110 is incident on the metal layer 1806 reach and/or are detected by the charged particle detector 202, a stronger "end point" signal is detected. This allows operators and/or automated milling systems to more accurately determine when the milling operation should be stopped.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, and/or embodiments according to the present disclosure, are intended to convey that the described component, feature, detail, structure, and/or embodiment is an example of components, features, details, structures, and/or embodiments according to the present disclosure. Thus, the described component, feature, detail, structure, and/or embodiment is not intended to be limiting, required, or exclusive/exhaustive; and other components, features, details, structures, and/or embodiments, including structurally and/or functionally similar and/or equivalent components, features, details, structures, and/or embodiments, are also within the scope of the present disclosure.

Examples of inventive subject matter according to the present disclosure are described in the following enumerated paragraphs.

A1. A charged particle detector assembly comprising: a charged particle detector; a first elongate member coupled with the charged particle detector; a second elongate member coupled with the charged particle detector, wherein the first elongate member and the second elongate member extend away from the charged particle detector; a drawing member coupled with the first elongate member, wherein the drawing member extends away from the first elongate member and toward the second elongate member; and at least one electrical connection point arranged to supply at least one bias voltage to the first elongate member, the second elongate member, and the drawing member.

A2. The charged particle detector assembly of paragraph A1, wherein the charged particle detector assembly is adapted for use with a charged particle tool having a platform for supporting a sample and wherein the charged particle detector is arranged proximate to the platform.

A2.1. The charged particle detector assembly of paragraph A2, wherein the first elongate member and the second elongate member are arranged to introduce a collecting electric field proximate the sample supported on the platform.

A2.2. The charged particle detector assembly of any of paragraphs A2-A2.1, wherein the sample is a DUT.

A2.2.1. The charged particle detector assembly of paragraph A2.2, wherein the DUT is a semiconductor chip.

A2.3. The charged particle detector assembly of any of paragraphs A2-A2.2.1, wherein the sample is a biological sample.

A2.4. The charged particle detector assembly of any of paragraphs A2-A2.3, wherein the sample is a material sample.

A2.5. The charged particle detector assembly of any of paragraphs A2-A2.4, wherein the charged particle tool comprises a focused charged beam system.

A2.5.1. The charged particle detector assembly of paragraph A2.5, wherein the focused charged beam system is a focused ion beam (FIB) system.

A2.6. The charged particle detector assembly of any of paragraphs A2-A2.5.1, wherein the charged particles are secondary electrons.

A2.6.1. The charged particle detector assembly of paragraph A2.6, wherein the secondary electrons are emitted by the sample as a result of a focused charged beam being incident on the sample.

A3. The charged particle detector assembly of any of paragraphs A1-A2.6.1, wherein the first elongate member and the second elongate member are configured to generate an electromagnetic field that draws charged particles from a charged particle source and to the charged particle detector.

A4. The charged particle detector assembly of any of paragraphs A1-A3, wherein the drawing member is configured to generate an electromagnetic field that applies a force that draws charged particles away from the charged particle source.

A4.1. The charged particle detector assembly of paragraph A4, wherein the drawing member is configured to generate an electromagnetic field that applies a force that reduces the amount of charged particles from the charged particle source that strike the charged particle tool.

A5. The charged particle detector assembly of any of paragraphs A1-A4.1, wherein the drawing member is a conductive wire.

A6. The charged particle detector assembly of any of paragraphs A1-A5, wherein the drawing member is curvilinear.

A7. The charged particle detector assembly of any of paragraphs A1-A6.1, wherein the drawing member is a conductive plate.

A7.1. The charged particle detector assembly of paragraph A7, wherein the drawing member is a conductive tape.

A8. The charged particle detector assembly of any of paragraphs A1-A7.1, wherein the first elongate member comprises a first end that is coupled with the charged particle detector and a second end that is opposite the first end.

A8.1. The charged particle detector assembly of paragraph A8, wherein the drawing member is coupled with the second end.

A8.2. The charged particle detector assembly of any of paragraphs A8-A8.1, wherein the drawing member is coupled to the first elongate member at a location within 0.05 mm, 1 mm, 2 mm, and/or 5 mm of the second end.

A9. The charged particle detector assembly of any of paragraphs A1-A8.2, wherein the drawing member extends radially outward from the first elongate member.

A10. The charged particle detector assembly of any of paragraphs A1-A9, wherein the drawing member comprises a first end that is coupled to the first elongate member and a second end that is opposite the first end.

10.1. The charged particle detector assembly of paragraph A10, wherein the second end is more proximate to the charged particle detector than the first end.

A10.2. The charged particle detector assembly of paragraph A10, wherein the first end is more proximate to the charged particle detector than the second end.

A10.3. The charged particle detector assembly of any of paragraphs A10-A10.2, wherein the drawing member further comprises a midpoint located between the first end and the second end, and wherein the midpoint is more proximate to the charged particle detector than the first end or the second end.

A10.4. The charged particle detector assembly of any of paragraphs A10-A10.3, wherein the drawing member further comprises a midpoint located between the first end and the second end, and wherein the midpoint is less proximate to the charged particle detector than the first end or the second end.

A11. The charged particle detector assembly of any of paragraphs A1-A10.4, wherein the drawing member further extends from the first elongate member at an angle toward from the charged particle detector.

A12. The charged particle detector assembly of any of paragraphs A1-A11, wherein the drawing member is further coupled with the second elongate member.

A13. The charged particle detector assembly of any of paragraphs A1-A12, wherein the drawing member is a first drawing member, and the charged particle detector assembly further comprising a second drawing member.

A13.1. The charged particle detector assembly of paragraph A13, wherein the second drawing member is coupled with the second elongate member, and wherein the second drawing member extends away from the second elongate member and toward the first elongate member.

A13.2. The charged particle detector assembly of any of paragraphs A13-A13.1, wherein the second drawing member is coupled with the second elongate member, and wherein the second drawing member extends away from the second elongate member and toward the drawing member.

A13.3. The charged particle detector assembly of any of paragraphs A13-A13.2, wherein the second drawing member is coupled with the first elongate member, and wherein the second drawing member extends away from the first elongate member and toward the second elongate member.

A13.4. The charged particle detector assembly of any of paragraphs A13-A13.3, wherein the at least one electrical connection point is further arranged to supply the at least one bias voltage to the second drawing member.

A14. The charged particle detector assembly of any of paragraphs A1-A13.4, further comprising a plurality of additional drawing members coupled with the first elongate member, wherein each of the additional drawing members extends away from the first elongate member and toward the second elongate member.

A14.1. The charged particle detector assembly of paragraph A14, wherein the first elongate member and the second elongate member each comprise a wire.

A15. The charged particle detector assembly of any of paragraphs A1-A14.1, wherein the drawing member is coupled with the first elongate member via an attachment member, wherein the attachment member comprises a first surface that is coupled to the first elongate member and a second surface that is coupled to the drawing member, wherein the second surface of the attachment member is more proximate to a/the sample than the first surface of the attachment member.

A16. The charged particle detector assembly of any of paragraphs A1-A15, wherein the charged particle detector assembly further comprises a projecting member coupled to the drawing member, wherein the projecting member extends away from the drawing member.

A16.1. The charged particle detector assembly of paragraph A16, wherein the projecting member extends toward the sample.

A16.2. The charged particle detector assembly of any of paragraphs A16-A16.1, wherein the projecting member is a cone.

A16.3. The charged particle detector assembly of any of paragraphs A16-A16.2, wherein the projecting member is a wire.

A17. The charged particle detector assembly of any of paragraphs A1-A16.3, wherein the charged particle detector assembly further comprises a path stabilization member coupled with the first elongate member, wherein the path stabilization member extends away from the first elongate member and toward the second elongate member, and the at least one electrical connection point is further arranged to supply the at least one bias voltage to the path stabilization member.

A17.1. The charged particle detector assembly of paragraph A17.1, wherein the path stabilization member is coupled to the first elongate member at a location on the first elongate member between the charged particle detector and the location where the drawing member is coupled to the first elongate member.

A17.2. The charged particle detector assembly of any of paragraphs A17-A17.1, wherein an electromagnetic field generated by the first elongate member, the second elongate members, and the drawing member defines a charged particle flow path within which a majority of the charged particles travel from the sample to the charged particle detector.

A17.2.1. The charged particle detector assembly of paragraph A17.2, wherein the path stabilization member generates an electromagnetic filed that applies a force that increases the number of charged particles that remain within the charged particle flow path as the charged particles travel from the sample and to the charged particle detector.

A17.2.2. The charged particle detector assembly of any of paragraphs A17.2-A17.2.1, wherein the electron flow path passes through a first location between the first elongate member, the second elongate member, the drawing member, and the path stabilization member, and a second location between the first elongate member, the second elongate member, the path stabilization member, and the charged particle detector.

A18. The charged particle detector assembly of any of paragraphs A1-A17.2.2, wherein the charged particle detector comprises a secondary electron detector.

A18.1. The charged particle detector assembly of paragraph A18, wherein the secondary electron detector comprises a scintillator.

A18.1.1. The charged particle detector assembly of paragraph A18.1, wherein the secondary electron detector comprises a ring arranged circumferentially about the scintillator, and wherein the first elongate member, the second elongate member, and the drawing member are electrically coupled with the ring.

A18.2. The charged particle detector assembly of any of paragraphs A18.1-A18.1, wherein the scintillator defines a disk shape defining an axis.

A18.2.1. The charged particle detector assembly of paragraph A18.2, wherein the drawing mechanism extends generally perpendicular to the axis.

A18.2.2. The charged particle detector assembly of any of paragraphs A18.2-A18.2.1, wherein the first elongate member and the second elongate member are coupled with the ring and each define a first section extending from the secondary electron detector generally parallel with the axis of the scintillator.

A18.2.2.1. The charged particle detector assembly of paragraph A18.2.2, wherein the first and the second elongate member each define a second section electrically coupled with the first section, the second section extending toward the axis of the scintillator.

A18.2.2.2. The charged particle detector assembly of any of paragraphs A18.2.2-A18.2.2.1, wherein first elongate member and the second elongate member each define a third section electrically coupled with the second section, the third section extending toward the axis of the scintillator at less an angle than the second section.

A18.2.2.3. The charged particle detector assembly of any of paragraphs A18.2.2-A18.2.2.2, wherein first elongate member and the second elongate member each define a fourth section electrically coupled with the third section, the fourth sections extending Substantially parallel to each other and further extending at an angle with respect to the axis of the scintillator.

A19. The charged particle detector assembly of any of paragraphs A1-A18.2.2.3, wherein the wire is of a material selected from the group comprising stainless steel, Ni, Cr, Pd, and Pt.

A20. The charged particle detector assembly of any of paragraphs A1-A19, further comprising: at least one additional elongate member coupled with the charged particle detector, the first, the second, and the at least one additional elongate member extending from the charged particle detector, and the at least one electrical connection point arranged to supply the at least one bias Voltage to the first, the second, and the at least one additional elongate member.

A21. The charged particle detector assembly of any of paragraphs A1-A20, wherein the first elongate member, the second elongate member, and the drawing member are electrically insulated from the charged particle detector.

A21.1. The charged particle detector assembly of paragraph 21, further comprising a first electrical connection adapted to supply a first bias Voltage to the charged particle detector and a second electrical connection adapted to supply a second bias Voltage to the first elongate member and the second elongate member.

A21.1.1. The charged particle detector assembly of paragraph 21.1, wherein the first bias voltage is different than the second bias Voltage.

A21.1.2. The charged particle detector of any of paragraphs A21.1-A21.1.1, where the second voltage is less than the first voltage.

A21.1.2.1. The charged particle detector of paragraph A21.1.2. wherein the first and second voltages are positive to create a first positive collecting electrical field and a second positive collecting field to attract secondary electrons emitted from a sample.

A21.1.2.2. The charged particle detector assembly of any of paragraphs A1-A21.1.2.1, wherein the first elongate member is electrically isolated from the second elongate member and wherein the at least one electrical connection point comprises a first electrical connection to provide a first bias voltage to the first elongate member and a second electrical connection to provide a second bias voltage to the second elongate member.

B1. A charged particle detector assembly comprising: a charged particle detector; a first elongate member coupled with the charged particle detector; a second elongate member coupled with the charged particle detector, wherein the first elongate member and the second elongate members extend away from the charged particle detector; a path stabilization member coupled with the first elongate member, wherein the path stabilization member extends away from the first elongate member and toward the second elongate member; and at least one electrical connection point arranged to supply at least one bias voltage to first elongate member, the second elongate member, and the path stabilization member.

B2. The charged particle detector assembly of paragraph B1, wherein the first elongate member and the second elongate member are configured to generate an electromagnetic field that draws charged particles from a source and to the charged particle detector.

B2.1. The charged particle detector assembly of paragraph B2, wherein the electromagnetic field further applies a force that reduces the amount of charged particles from the source that strike the charged particle tool.

B2.2. The charged particle detector assembly of any of paragraphs B2-B2.1, wherein electromagnetic field defines a charged particle flow path within which a majority of the charged particles travel from the sample to the detector, and wherein the path stabilization member generates an electromagnetic filed that applies a force that increases the number of charged particles that remain within the charged particle flow path as the charged particles travel from the sample and to the charged particle detector.

B2.3. The charged particle detector assembly of any of paragraphs B2-B2.2, wherein the electron flow path passes through a first location between the first elongate member, the second elongate member, the drawing member, and the path stabilization member, and a second location between the first elongate member, the second elongate member, the path stabilization member, and the charged particle detector.

C1. A charged particle tool comprising: a platform for supporting a sample; a charged particle beam source configured to cause a focused charged particle beam to be incident on the sample; and the charged particle assembly of paragraphs A1-A21.1.2.2. or B1-B2.3, wherein the charged particle detector is arranged proximate to the platform.

D1. Use of the charged particle detector assembly of any of paragraphs A1-A21.1.2.2.

E1. Use of the charged particle detector assembly of any of paragraphs B1-B2.1.

F1. Use of the charged particle tool of paragraph C1.

What is claimed is:

1. A charged particle detector assembly comprising:
    a charged particle detector;
    a first elongate member coupled with the charged particle detector;
    a second elongate member coupled with the charged particle detector, wherein the first elongate member and the second elongate member extend away from the charged particle detector;
    a drawing member coupled with the first elongate member, wherein the drawing member extends away from the first elongate member and toward the second elongate member, and comprises a first side that is coupled to the first elongate member and a second side that is opposite the first side and coupled to the second elongate member; and
    at least one electrical connection point arranged to supply at least one bias voltage to the first elongate member, the second elongate member, and the drawing member.

2. The charged particle detector assembly of claim 1, wherein the charged particle detector assembly is adapted for use with a charged particle tool having a platform for supporting a sample and wherein the charged particle detector is arranged proximate to the platform.

3. The charged particle detector assembly of claim 2, wherein when the at least one bias voltage is supplied to the first elongate member, the second elongate member, and the drawing member:
    the first elongate member and the second elongate member are configured to introduce a collecting electric field proximate the sample supported on the platform that guides charged particles emitted by the sample to the charged particle detector; and
    the drawing member is configured to introduce a drawing electric field proximate the sample supported on the platform that guides the charged particles emitted by the sample away from a surface of the sample and into a stronger region of the collecting electric field.

4. The charged particle detector assembly of claim 3, wherein the charged particle tool comprises a focused charged beam system, and the charged particles are emitted by the sample based on a focused charged particle beam being incident on the sample.

5. The charged particle detector assembly of claim 2, further comprising a conductive projection member that is electrically connected to the drawing member, wherein the conductive projection member extends from the drawing member and toward the sample.

6. The charged particle detector assembly of claim 2, wherein the drawing member is coupled with the first elongate member via an attachment member, wherein the attachment member comprises a first surface that is coupled to the first elongate member and a second surface that is coupled to the drawing member, and wherein the second surface of the attachment member is more proximate to the sample than the first surface of the attachment member.

7. The charged particle detector assembly of claim 1, wherein the drawing member is electrically connected to the first elongate member, and electrically insulated from the second elongate member.

8. The charged particle detector assembly of claim 1, wherein the drawing member comprises a first side that is coupled to the first elongate member and a second side that is opposite the first side, and wherein the first side is more proximate to the charged particle detector than the second side.

9. The charged particle detector assembly of claim 1, wherein the drawing member comprises a first side that is coupled to the first elongate member, a second side that is opposite the first side, and a midpoint between the first side and the second side, and wherein the midpoint is less proximate to the charged particle detector than the first side or the second side.

10. The charged particle detector assembly of claim 1, wherein the first elongate member comprises a first end that is coupled with the charged particle detector and a second end that is opposite the first end, and wherein the drawing member is coupled with the second end of the first elongate member.

11. The charged particle detector assembly of claim 1, wherein the drawing member is a first drawing member, and the charged particle detector assembly further comprising a second drawing member that is coupled with the first elongate member and the second elongate member, and wherein the second drawing member extends is positioned between the first drawing member and the charged particle detector.

12. The charged particle detector assembly of claim 1, wherein the drawing member is a first drawing member, and the charged particle detector assembly further comprising a second drawing member coupled with the second elongate member, wherein the second drawing member extends away from the second elongate member and toward the drawing member.

13. The charged particle detector assembly of claim 1, wherein the drawing member is a wire.

14. The charged particle detector assembly of claim 1, wherein the drawing member is a plate.

15. The charged particle detector assembly of claim 1, wherein the charged particle detector assembly further comprises a path stabilization member coupled with the first elongate member, wherein the path stabilization member extends away from the first elongate member and toward the second elongate member, and the at least one electrical connection point is further arranged to supply the at least one bias voltage to the path stabilization member.

16. The charged particle detector assembly of claim 15, wherein the path stabilization member is coupled to the first elongate member at a location on the first elongate member between the charged particle detector and the location where the drawing member is coupled to the first elongate member.

17. The charged particle detector assembly of claim 15, wherein when the at least one bias voltage is applied to each of the first elongate member, the second elongate member, the drawing member, and the path stabilization member:
the first elongate member, the second elongate member, and the drawing member generate a first electromagnetic field that defines a charged particle flow path within which a majority of charged particles travel from a sample to the charged particle detector, and
the path stabilization member generates a second electromagnetic field that applies a force that increases a number of charged particles that remain within the charged particle flow path as the charged particles travel from the sample and to the charged particle detector.

18. The charged particle detector assembly of claim 17, wherein the charged particle flow path passes through a first location between the first elongate member, the second elongate member, the drawing member, and the path stabilization member, and a second location between the first elongate member, the second elongate member, the path stabilization member, and the charged particle detector.

19. A charged particle guide assembly comprising:
a first elongate member configured to be coupled with a charged particle detector;
a second elongate member configured to be coupled with the charged particle detector, wherein when the first elongate member and the second elongate member are coupled with the charged particle detector the first elongate member and the second elongate member extend away from the charged particle detector;
a plurality of drawing members coupled between the first and second elongate members, wherein at least one drawing member of the plurality of drawing members:
comprises a first side that is coupled to the first elongate member and a second side that is opposite the first side and coupled to the second elongate member; and
is electrically connected to at least one of the first elongate member and extends from the first elongate member toward the second elongate member; and
at least one electrical connection point arranged to supply at least one bias voltage to the first elongate member, the second elongate member, and the drawing member.

* * * * *